United States Patent
Wierer, Jr. et al.

(10) Patent No.: US 7,697,584 B2
(45) Date of Patent: Apr. 13, 2010

(54) LIGHT EMITTING DEVICE INCLUDING ARRAYED EMITTERS DEFINED BY A PHOTONIC CRYSTAL

(75) Inventors: Jonathan J. Wierer, Jr., Pleasanton, CA (US); Mihail M. Sigalas, Santa Clara, CA (US)

(73) Assignee: Philips Lumileds Lighting Company, LLC, San Jose, CA (US)

( * ) Notice: Subject to any disclaimer, the term of this patent is extended or adjusted under 35 U.S.C. 154(b) by 29 days.

(21) Appl. No.: 11/537,940

(22) Filed: Oct. 2, 2006

(65) Prior Publication Data

US 2008/0080581 A1 Apr. 3, 2008

(51) Int. Cl.
*H01S 5/00* (2006.01)

(52) U.S. Cl. ............... 372/45.01; 372/46.01; 372/43.01; 372/22; 372/21; 372/23

(58) Field of Classification Search ............... 372/45.01, 372/46.01, 43.01, 22, 21, 23
See application file for complete search history.

(56) References Cited

U.S. PATENT DOCUMENTS

| | | | |
|---|---|---|---|
| 7,098,589 B2 * | 8/2006 | Erchak et al. | 313/498 |
| 2003/0141507 A1 * | 7/2003 | Krames et al. | 257/79 |
| 2004/0206972 A1 | 10/2004 | Erchak et al. | |
| 2005/0151145 A1 | 7/2005 | Lin et al. | |
| 2005/0173714 A1 | 8/2005 | Lee et al. | |
| 2006/0027815 A1 | 2/2006 | Wierer, Jr. et al. | |
| 2007/0221867 A1 * | 9/2007 | Beeson et al. | 250/487.1 |

FOREIGN PATENT DOCUMENTS

EP 1526583 A2 4/2005

OTHER PUBLICATIONS

Hiroyuki Ichikawa et al., "Efficiency enhancement in a light-emitting diode with a two-dimensional surface grating photonic crystal," Applied Physics Letters, vol. 84, No. 4 (Jan. 26, 2004) pp. 457-459.
Y.-S. Choi et al., "GaN blue photonic crystal membrane nanocavities," Applied Physics Letters 87, 243101 (2005), pp. 1-3.
M. Kitamura et al., "Enhanced light emission from an organic photonic crystal with a nanocavity," Applied Physics Letters 87, 151119 (2005), pp. 1-3.
Noriyuki Yokouchi et al., "Vertical-cavity surface-emitting laser operating with photonic crystal seven-point defect structure," Applied Physics Letters, vol. 82, No. 21 (May 26, 2003) pp. 3608-3610.

(Continued)

*Primary Examiner*—Minsun Harvey
*Assistant Examiner*—Kinam Park
(74) *Attorney, Agent, or Firm*—Patent Law Group; Rachel V. Leiterman

(57) ABSTRACT

A light emitting device includes a structure with a light emitting region disposed between an n-type region and a p-type region. A plurality of holes in the structure, which form a photonic crystal, are formed in a first region of the structure corresponding to a first portion of the light emitting region. A second region of the structure corresponding to a second portion of the light emitting region is free of holes. The device is configured such that when forward biased, current is injected in the second region and the first region is substantially free of current.

35 Claims, 10 Drawing Sheets

OTHER PUBLICATIONS

Maxime Rattier et al., "Toward Ultrahigh-Efficiency Aluminum Oxide Microcavity Light-Emitting Diodes: Guided Mode Extraction by Photonic Crystals," IEEE Journal on Selected Topics in Quantum Electronics, vol. 8, No. 2, Mar./Apr. 2002, pp. 238-246.

J. Dorsaz et al., "Selective oxidation of AlInN Layers for current confinement in III-nitride devices," Applied Physics Letters 87, 072102 (2005), pp. 1-3.

Tomoyuki Yoshie et al., "High quality two-dimensional photonic crystal slab cavities," Applied Physics Letters, vol. 79, No. 26 (Dec. 24, 2001) pp. 4289-4291.

Hong-Gyu Park et al., "Electrically Driven Single-Cell Photonic Crystal Laser," Sep. 3, 2004, vol. 305 Science (www.sciencemag.org), pp. 1444-1447.

J. Sabarinathan et al., "An electrically injected InAs/GaAs quantum-dot photonic crystal microcavity light-emitting diode," Applied Physics Letters, vol. 81, No. 20 (Nov. 11, 2002) pp. 3876-3878.

Hatice Altug et al., "Two-dimensional coupled photonic crystal resonator arrays," Applied Physics Letters, vol. 84, No. 2 (Jan. 12, 2004) pp. 161-163.

International Search Report and Written Opinion, 13 pages.

\* cited by examiner

LIGHT EMITTING DEVICE INCLUDING ARRAYED EMITTERS DEFINED BY A PHOTONIC CRYSTAL

BACKGROUND

1. Field of Invention

The present invention relates to a semiconductor light emitting device including a photonic crystal.

2. Description of Related Art

Semiconductor light-emitting devices including light emitting diodes (LEDs), resonant cavity light emitting diodes (RCLEDs), vertical cavity laser diodes (VCSELs), and edge emitting lasers are among the most efficient light sources currently available. Materials systems currently of interest in the manufacture of high-brightness light emitting devices capable of operation across the visible spectrum include Group III-V semiconductors, particularly binary, ternary, and quaternary alloys of gallium, aluminum, indium, and nitrogen, also referred to as III-nitride materials. Typically, III-nitride light emitting devices are fabricated by epitaxially growing a stack of semiconductor layers of different compositions and dopant concentrations on a suitable substrate by metal-organic chemical vapor deposition (MOCVD), molecular beam epitaxy (MBE), or other epitaxial techniques. The stack often includes one or more n-type layers doped with, for example, Si, formed over the substrate, a light emitting or active region formed over the n-type layer or layers, and one or more p-type layers doped with, for example, Mg, formed over the active region.

The quality of an LED can be characterized by, for example, its radiance, which is the power emitted in a specified direction per unit area of an emitting device, and its extraction efficiency, which is the ratio of photons extracted from the device to photons generated in the light emitting region. The extraction efficiency is limited by, among other things, the emitted photons suffering multiple total internal reflections at the walls of the high refractive index semiconductor crystal that forms the p-type, n-type, and light emitting regions of the device. As a result, many of the emitted photons do not escape into free space, leading to poor extraction efficiencies, typically less than 30%.

U.S. Pat. No. 5,955,749, entitled "Light Emitting Device Utilizing a Periodic Dielectric Structure," granted to J. Joannopoulos et al., describes the use of a photonic crystal to enhance the extraction efficiency. A photonic crystal is created by forming a lattice of holes through the semiconductor layers of the light emitting diode. The lattice of holes creates a medium with a periodically modulated dielectric constant, affecting the way light propagates through the medium. If the proper lattice spacing is chosen, light that would otherwise have been trapped in the structure by total internal reflection can now escape, increasing the extraction efficiency of the LED. Needed in the art are efficient photonic crystal designs.

SUMMARY

In accordance with embodiments of the invention, a light emitting device includes a semiconductor structure with a light emitting region disposed between an n-type region and a p-type region. A plurality of holes in the semiconductor structure, which form a photonic crystal, are formed in a first region of the semiconductor structure corresponding to a first portion of the light emitting region. A second region of the semiconductor structure corresponding to a second portion of the light emitting region does not contain a photonic crystal and may be surrounded by the first region. The device is configured such that when forward biased, current is injected in the second region and the first region is substantially free of current. Accordingly, light is generated only in the second region, which is uninterrupted by the photonic crystal. Separating the areas of the light emitting region where light is generated from the photonic crystal may avoid surface recombination caused by etching the photonic crystal through the p-n junction. The n and p-type regions may be kept thin for reduced optical mode volume. The semiconductor structure may be backed by a reflective contact to direct light out one side.

DETAILED DESCRIPTION

Figure 1:
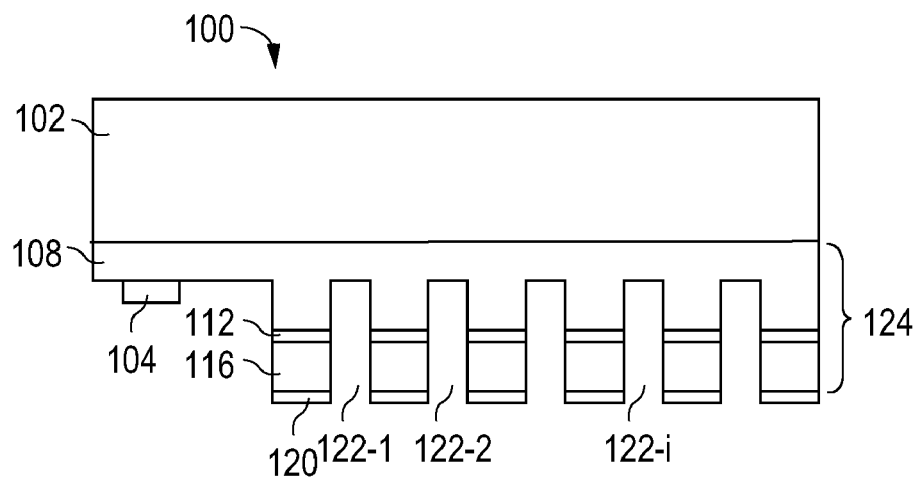
FIG. 1 illustrates a III-nitride device including a photonic crystal.

FIG. 1 illustrates a III-nitride photonic crystal LED (PX-LED) 100, described in more detail in Publication No. 2003/0141507, "LED Efficiency Using Photonic Crystal Structure," filed Jan. 28, 2002 and incorporated herein by reference.

In PXLED 100 of FIG. 1, an n-type region 108 is formed over growth substrate 102 which may be, for example, sapphire, SiC, or GaN; an active region 112 is formed over n-type region 108; and a p-type region 116 is formed over active region 112. Each of regions 108, 112, and 116 may be a single layer or multiple layers of the same or different composition, thickness, or dopant concentration. A portion of p-type region 116 and active region 112 are etched away to expose a portion of n-type region 108, then a p-contact 120 is formed on p-type region 116 and an n-contact 104 is formed on the exposed portion of n-type region 108. The device may be flipped over, as illustrated in FIG. 1, and connected to a mount (not shown) through contacts 104 and 120.

Active region 112 includes a junction region where electrons from n-type region 108 combine with holes of p-type region 116 and ideally emit energy in the form of photons. Active layer 112 may include a quantum well structure to optimize the generation of photons. Many different quantum well structures have been described, for example, by G. B. Stringfellow and M. George Craford in "High Brightness Light Emitting Diodes," published by the Associated Press in 1997. The photonic crystal of PXLED 100 of FIG. 1 is created by forming a periodic structure of holes 122-$i$ in the LED.

The photonic crystal device illustrated in FIG. 1 and the devices described in U.S. Pat. No. 5,955,749 may have several disadvantages. For example, the photonic crystal structure in the device of FIG. 1 may be formed by dry etching into the p-type region to form an array of holes that form a periodic structure. Dry etching of p-type III-nitride material in particular may be problematic because etching can damage the crystal, causing nitrogen vacancies which create n-type donors. In p-type region 116 of FIG. 1, the presence of n-type donors lowers the concentration of holes and, in cases of severe damage to the crystal, can change the conductivity type of region 116 to n-type, such that the p-n junction is ruined and the device cannot operate. Also, etching through quantum wells in the active region creates surface recombination, potentially lowering the efficiency of the device.

Figure 21:
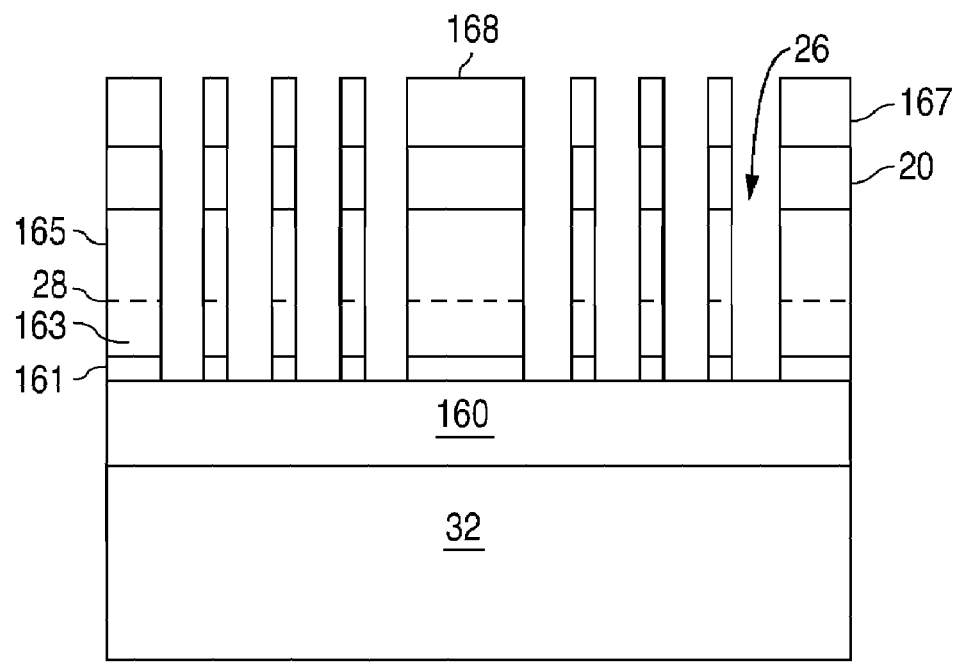
FIG. 21 is a cross sectional view of a part of a device with a photonic crystal and a semiconductor layer suitable for lateral oxidation.
Figure 22:
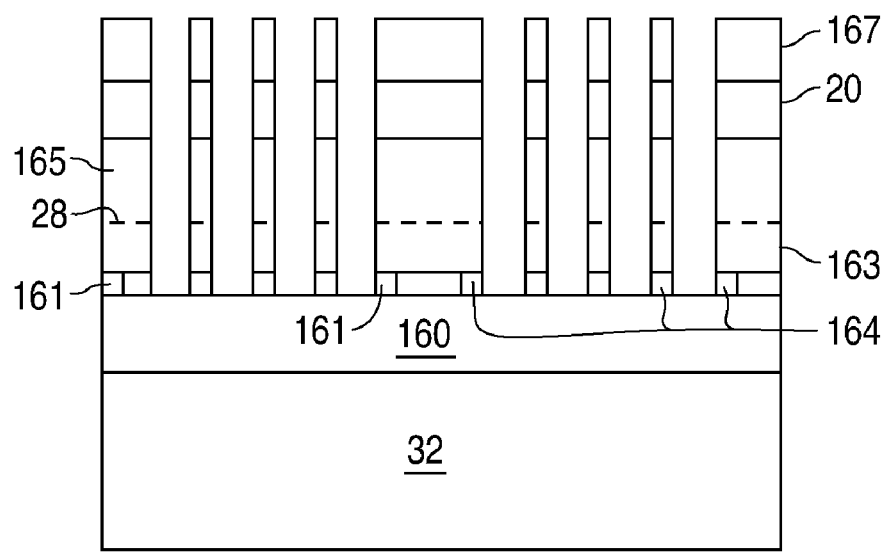
FIG. 22 is a cross sectional view of part of the device of FIG. 21 after oxidizing one of the layers in the epitaxial structure.
Figure 23:
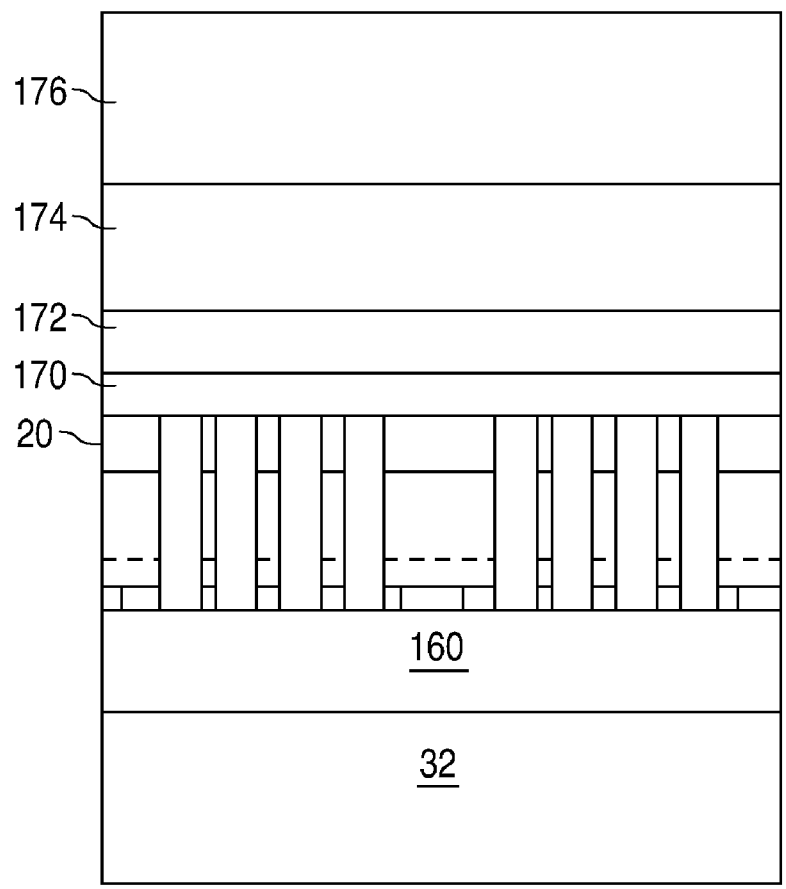
FIG. 23 is a cross sectional view of the device of FIG. 22 after removing the mask and bonding the structure to a host substrate.

In accordance with embodiments of the invention, a semiconductor light emitting device includes one region with a photonic crystal and another region without a photonic crystal. The region with a photonic crystal is not electrically active in the device. This is achieved by, for example, implanting the photonic crystal region with a nonconductive species as illustrated in FIGS. 4-8, by not contacting the photonic crystal region, or by laterally oxidizing a layer within the semiconductor structure as illustrated in FIGS. 21-23, such that current flows and therefore light is generated only in the region without the photonic crystal. Such an arrangement may avoid any loss of efficiency caused by damage to the semiconductor structure caused by etching the photonic crystal.

Figure 2:
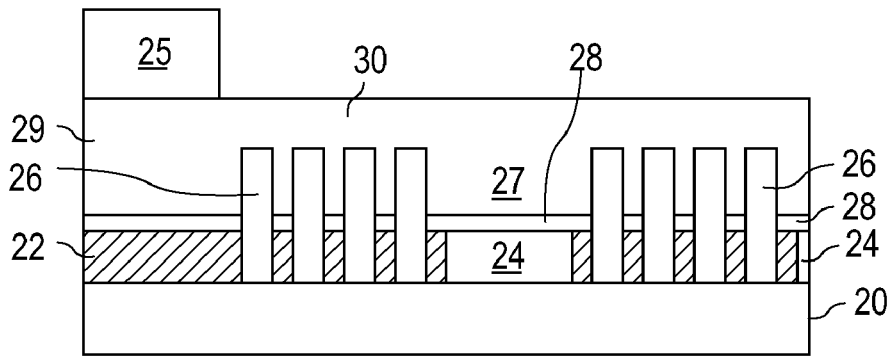
FIG. 2 is a cross sectional view of a part of a photonic crystal light emitting device according to embodiments of the invention.

FIG. 2 is a cross sectional view of a part of a semiconductor light emitting device including a photonic crystal, according to embodiments of the invention. The device of FIG. 2 includes an epitaxial structure including light emitting region 28 disposed between an n-type region including regions 27, 29, and 30, and a p-type region 24.

The semiconductor material that forms n-type regions 27, 29, and 30 may include multiple layers of different compositions and dopant concentration including, for example, preparation layers such as buffer layers or nucleation layers which may be n-type or not intentionally doped, release layers designed to facilitate release of the growth substrate or thinning of the semiconductor structure after substrate removal, and n-type device layers designed for particular optical or electrical properties desirable for the light emitting region to efficiently emit light. Like the n-type region, the semiconductor material that forms p-type region 24 may also include multiple layers of different composition, thickness, and dopant concentration.

Light emitting region 28 may include, for example, one or more thick or thin light emitting layers. Examples of suitable light emitting regions include a single light emitting layer with a thickness greater than, for example, 50 angstroms, and a multiple quantum well light emitting region including multiple thin quantum well light emitting layers each with a thickness between, for example, 20 and 30 angstroms, separated by barrier layers.

An n-contact 25 is electrically connected to n-type region 29 and a p-contact 20 is electrically connected to p-type region 24. P-contact 20 may be reflective (for example, greater than 75% reflective) to minimize light loss and direct light out the top side of the device. A portion 22 of the epitaxially grown material adjacent to p-type region 24 is made nonconductive. Photonic crystal regions, which are typically periodic arrays of holes 26 in the epitaxial material, are formed in the area of nonconductive region 22. Current flows from n-contact 25 into n-type region 29, then spreads through n-type region 30 in the vicinity of holes 26 to n-type region 24. Current flows from p-contact 20 only in p-type region 24, since region 22 is nonconductive or very poorly conducting. Accordingly, electrons and holes can recombine only in the portion or portions of light emitting region 28, referred to as the emitters, located between n-type region 27 and p-type region 24. The photonic crystal regions permit light that would otherwise be totally internally reflected to escape, thus potentially increasing the extraction of light emitted in the emitters. Alternatively the photonic crystal region reflects laterally propagating light within the semiconductor structure. Light is confined in the emitters where it can be extracted efficiently. Light may be extracted from the emitters, from the photonic crystal region, or from both.

Figure 3:
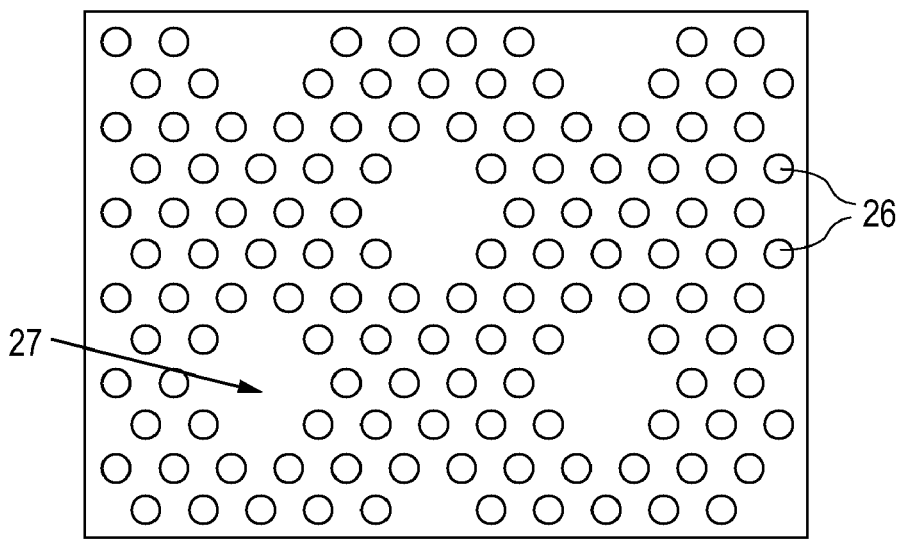
FIG. 3 is a plan view of a part of the device illustrated in FIG. 2.

FIG. 3 is a plan view of a portion of the device illustrated in cross section in FIG. 2. Light is emitted only in the emitters underlying n-type regions 27 (shown in FIG. 2). In areas with holes 26 forming a photonic crystal, nonconductive material prevents current from being injected in the light emitting region, thus no light is emitted from these areas. Light may extracted from the regions with holes 26 which form a photonic crystal, as well as from the emitters, in which no holes are formed. The lattice shown in FIG. 3 is a triangular lattice. Four holes are omitted from the triangular lattice to form each emitter. The size, shape, and spacing of the emitters may differ from what is shown in FIG. 3 and may be arbitrary. In other embodiments, more or fewer holes, such as one hole or seven holes, may be omitted for each emitter. Though the emitters may have any arbitrary shape, they are generally compact, for example roughly circular or square, with a diameter or diagonal between 0.15 µm and 3 µm, more preferably between 0.3 µm and 0.9 µm, and more preferably between 0.35 µm and 0.7 µm. Alternatively, the emitters may be long and narrow rather than compact. The emitters are generally spaced between 0.3 µm and 10 µm apart, more preferably between 0.6 µm and 3 µm, and more preferably between 0.7 µm and 2.5 µm. The distance between emitters may vary such that the emitters are not evenly spaced. Lattices besides triangular lattices may be used, as described below. Holes are periodically omitted from these lattices to form emitters, as illustrated in FIG. 3 for a triangular lattice.

The photonic crystal structure in the regions between the emitters is typically a periodic variation of the thickness of the epitaxial structure, with alternating maxima and minima. An example is a grating (one-dimensional lattice) or planar lattice of holes 26 (two-dimensional lattice). The lattice is characterized by the lattice type, the diameter of the holes d, the lattice constant a, which measures the distance between the centers of nearest neighbor holes, the depth of the holes w, and the dielectric constant of the dielectric disposed in the holes (often air), $\epsilon_h$.

Parameters a, d, w, $\epsilon_h$, the size and shape of the emitters, and the distance between the emitters thus influence the radiation pattern emitted by the device, and can be selected to enhance the extraction efficiency from the device. Alternatively, when the proper photonic crystal and emitter parameters are chosen, the radiation pattern of the emitted light can be narrowed, increasing the radiance of the LED. This is useful in applications where light at only specific angles is useful. In one embodiment, the photonic crystal parameters are chosen such that greater than 50% of radiation exiting the device is emitted in an exit cone defined by an angle of 45 degrees to an axis normal to a surface of the device.

Figure 19:
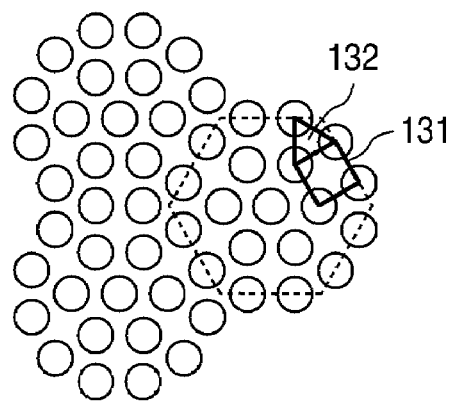
FIGS. 19 and 20 are plan views of two quasi-crystal photonic crystal structures.
Figure 20:
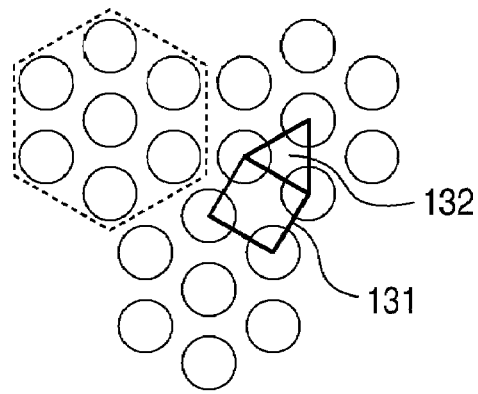

Holes 26 can be arranged to form triangular, square, hexagonal, honeycomb, or other two-dimensional lattice types, including quasi-crystals, as illustrated in FIGS. 19 and 20. A quasi-crystal is a pattern of holes located on the vertices of a repeating pattern of squares 131 and triangles 132. Such a repeating pattern is often referred to as an Archimedean lattice or a penrose tile. The lattice constant a of a quasi-crystal is the length of a side of a triangle or square in the repeating pattern. In some embodiments, different lattice types are formed in different regions of the device. Holes 26 can have circular, square, hexagonal, or other cross sections. In some embodiments, the lattice spacing a is between about 0.1 λ and about 10 λ, preferably between about 0.1 λ and about 4 λ, where λ is the wavelength in the device of light emitted by the active region. In some embodiments, holes 26 may have a diameter d between about 0.1 a and about 0.5 a, where a is the lattice constant. In some embodiments, the ratio of hole radius to lattice constant a may range from 0.2 to 0.45. Holes 26 can be filled with air or with an optional dielectric of dielectric constant $\epsilon_h$, often between about 1 and about 16. Possible dielectrics include silicon oxides.

The emitters are surrounded by photonic crystal regions in the lateral direction (x-y direction) and by a reflective p-contact 20 and air in the z direction, creating a micro-cavity with resonances in all directions. The micro-cavity may offer superior control of the light. As the semiconductor structure is thinned the optical mode volume is reduced in the z-direction. The mode volume in the lateral direction is controlled by the size of the emitter and the photonic crystal that surrounds it. Fewer waveguided modes can be trapped in the cavity as the mode volume is reduced, increasing the likelihood light will exit the device. The photonic crystal regions either help in extracting these modes or confine the light entirely within the emitter where is can be extracted out of the device. The proper choice of photonic crystal and emitter parameters may maximize extraction from the device.

Finite difference time domain (FDTD) modeling of some of the devices described herein predicts higher radiance and higher extraction efficiency in a device with photonic crystal regions separated by regions without a photonic crystal, than in the same device with a continuous, uninterrupted photonic crystal.

Figure 16:
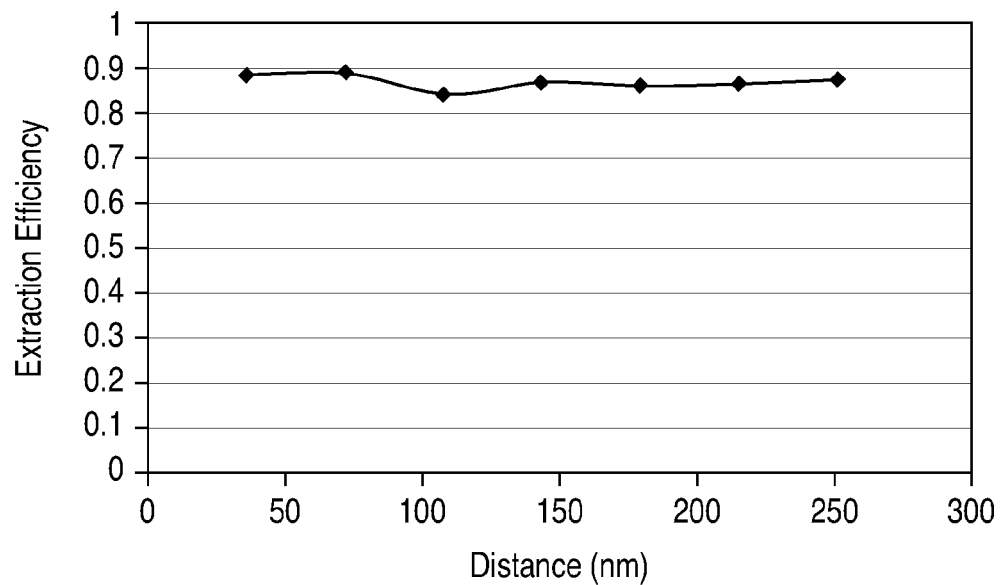
FIG. 16 is a plot of extraction efficiency as a function of distance between the light emitting region and a reflective layer disposed on the bottom of the semiconductor structure.

FDTD modeling also predicts that separating the light generating regions of the device from the photonic crystal reduces the sensitivity of the extraction efficiency and radiance to the distance between the light emitting region and the reflective contact, which can be difficult to control. In particular, in devices where the photonic crystal structure is etched beginning in a p-type region, such as the devices illustrated in FIGS. 2 and 9, there is very little sensitivity to the placement of the light emitting region. FIG. 16 is a plot of extraction efficiency as a function of the distance between reflective p-contact 20 and light emitting region 28 for the device illustrated in FIG. 2. As illustrated in FIG. 16, the extraction efficiency does not significantly change as the distance between p-contact 20 and light emitting region 28 changes.

Figure 17:
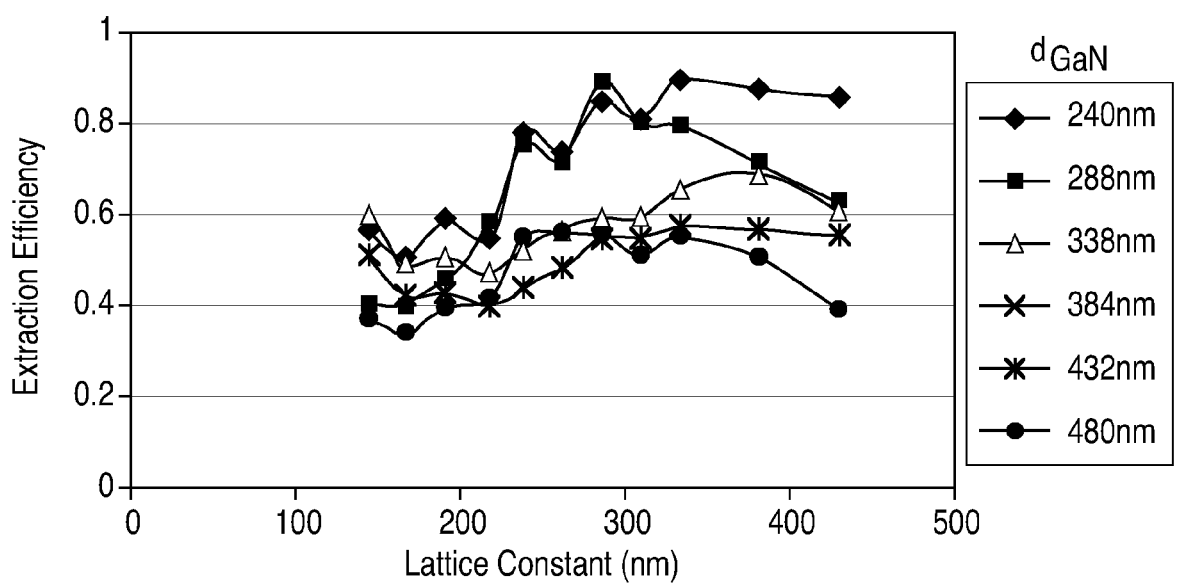
FIG. 17 is a plot of extraction efficiency as a function of photonic crystal lattice constant for several semiconductor structure thicknesses.

In addition, FDTD modeling predicts that for a given device design, the extraction efficiency improves as the total thickness of the thickest part of the epitaxial structure decreases. FIG. 17 is a plot of extraction efficiency as a function of photonic crystal lattice constant for devices with the structure illustrated in FIG. 2, with differing epitaxial structure thickness. The diamonds represent a device with an epitaxial structure thickness of about 240 nm, the squares represent a device with an epitaxial structure thickness of about 288 nm, the triangles represent a device with an epitaxial structure thickness of about 336 nm, the x's represent a device with an epitaxial structure thickness of about 384 nm, the asterisks represent a device with an epitaxial structure thickness of about 432 nm, and the circles represent a device with an epitaxial structure thickness of about 480 nm. As illustrated in FIG. 17, in general, regardless of the lattice constant, the extraction efficiency improves as the epitaxial structure thickness decreases. Accordingly, in some embodiments, the epitaxial structure is limited to no more than 500 nm thick, more preferably to no more than 400 nm thick, and more preferably to no more than 300 nm thick. As the thickness of the epitaxial structure decreases, the distance current can spread, particularly in the n-type region where the contact area may be limited, is reduced. Accordingly, devices with thinner epitaxial structures may require closer spacing of n-type contact metals than devices with thicker epitaxial structures.

Figure 18:
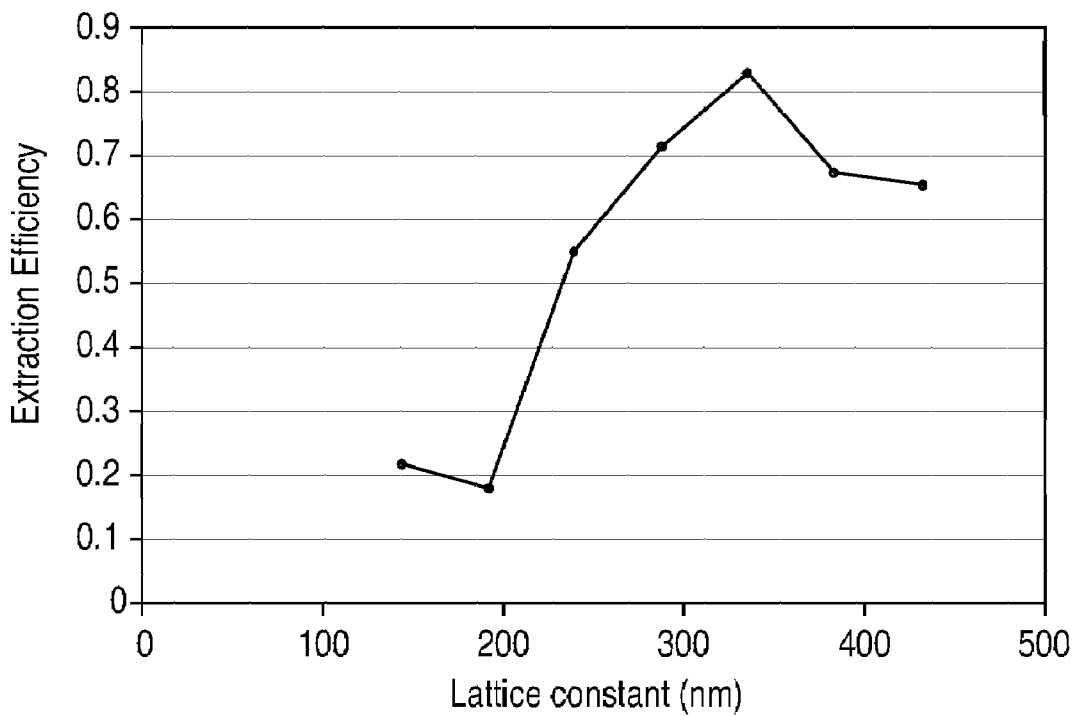
FIG. 18 is a plot of extraction efficiency as a function of photonic crystal lattice constant.

Further, FDTD modeling predicts the optimal photonic crystal lattice constant. FIG. 18 is a plot of extraction efficiency as a function of lattice constant for a device with the structure illustrated in FIG. 2. As illustrated in FIG. 18, as the photonic crystal lattice constant increases above 200 nm, the extraction efficiency increases to a peak at a lattice constant between 300 and 400 nm. Accordingly, in some embodiments, the photonic crystal lattice constant is between 200 and 500 nm, more preferably between 300 and 400 nm. In the data shown in FIG. 18, the emitters in the device were the size of seven photonic crystal holes. In general, larger emitters are more sensitive to lattice constant than smaller emitters.

FIGS. 4-8 illustrate a method of forming the device illustrated in FIGS. 2 and 3. In the partial device illustrated in FIG. 4, an n-type region 34 is grown conventionally over a suitable growth substrate 32. A light emitting region 28 is grown over n-type region 34, followed by a p-type region 24. A mask 36, which may be, for example, $SiO_2$, is deposited over p-type region 24, then patterned to form openings 38, for example using a high resolution lithography technique such as electron beam lithography, nano-imprint lithography, extreme UV lithography, deep X-ray lithography, interferometric lithography, hot embossing, or microcontact printing. The p-type semiconductor material beneath mask openings 38 is implanted, for example with hydrogen, to form nonconductive regions 22. The implant does not penetrate mask 36 in the areas intended to be uninterrupted by the photonic crystal. The implant must travel the depth of p-type region 24, as well as the lateral distance between the holes of the photonic crystal (a distance of approximately (a-d)/2). The implant conditions for the isotropic implant step are selected such that the implant travels the longer of the two distances. The implant may travel deeper than the depth of nonconductive regions 22 shown in FIG. 4.

Figure 4:
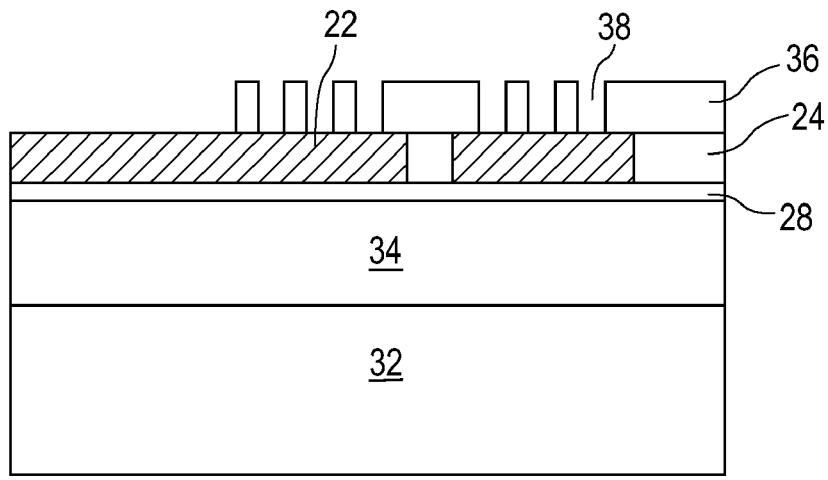
FIG. 4 is a cross sectional view of a part of a device with a mask for forming a photonic crystal and implanting the p-type region.
Figure 5:
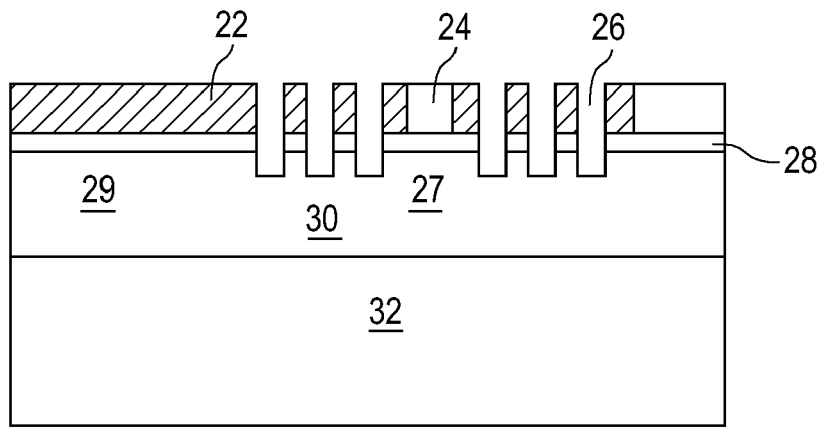
FIG. 5 is a cross sectional view of the device of FIG. 4 after etching the photonic crystal and stripping the mask.

In FIG. 5, the epitaxial structure is etched to form the array of holes 26 which form the photonic crystal, for example using a conventional dry etching technique such as reactive ion, inductively coupled plasma, focused ion beam, sputter etching, electron cyclotron resonance, or chemically assisted ion beam etching. Damage caused by dry etching can be mitigated by a subsequent short wet chemical etch, anneal, a combination thereof, or other surface passivation techniques. Holes 26 are formed only where the p-type semiconductor layer has been implanted to form nonconductive material 22. Mask 36 (FIG. 4) is then removed by a process suitable to the mask. As an alternative to the process described above, holes 26 may be etched first, then the structure may be implanted. Techniques besides etching may be used to form holes 26, such as epitaxial lateral overgrowth.

Figure 6:
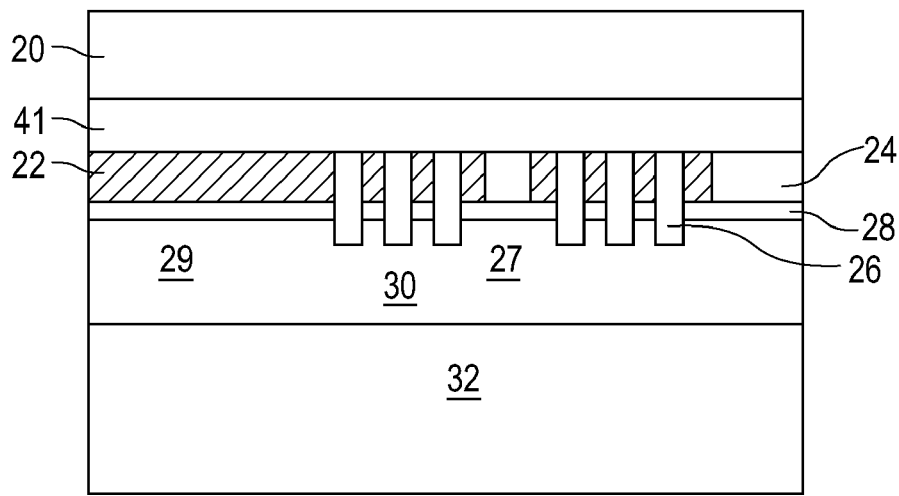
FIG. 6 is a cross sectional view of the device of FIG. 5 after depositing contact materials.

In FIG. 6, p-contact 20 is formed over the surface of the device. P-contact 20 is generally a reflective material such as silver formed in a continuous sheet, as shown in FIG. 6. P-contact 20 may be deposited by angled evaporation, to avoid depositing metal in holes 26. An optional conductive oxide 41 for spreading current and boosting the reflectivity of p-contact 20, which may be, for example, indium tin oxide, ZnO:Ga, or InO:Ga, may be formed between the top surface of the epitaxial structure and p-contact 20, for example by evaporation.

Figure 7:
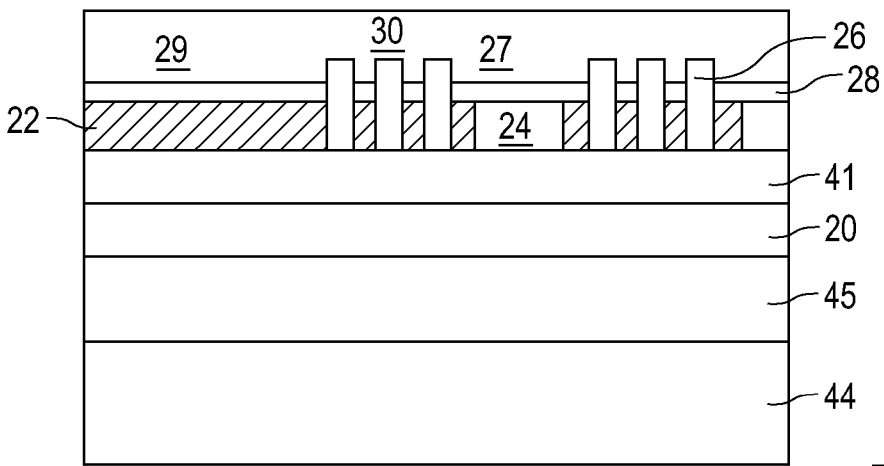
FIG. 7 is a cross sectional view of the device of FIG. 6 after bonding to a host and removing the growth substrate.

In FIG. 7, the device is flipped relative to the orientation shown in FIGS. 4, 5, and 6, and connected to a host substrate 44, for example by one or more metal or non-metal bonding layers 45. Growth substrate 32 is removed by a technique appropriate to the substrate material, for example laser melting for a sapphire substrate or etching for a SiC or composite substrate. Removing growth substrate 32 exposes a surface of the epitaxial structure, often an n-type region.

Figure 8:
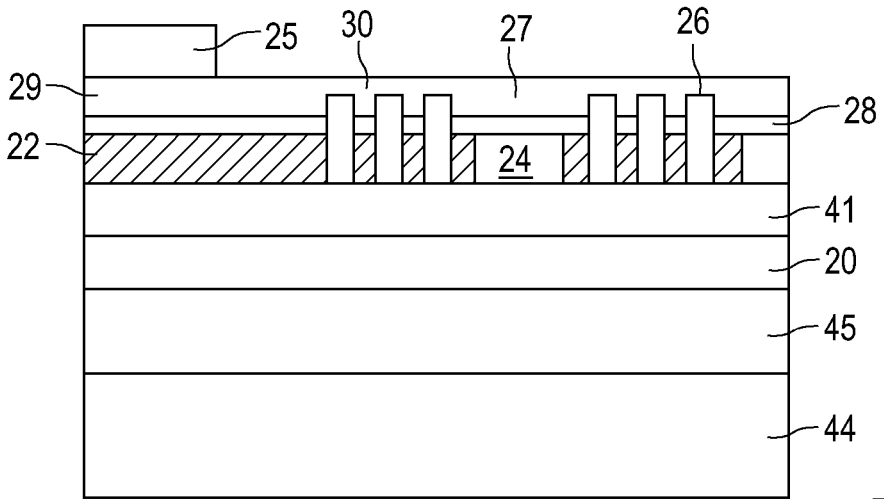
FIG. 8 is a cross sectional view of the device of FIG. 7 after thinning the epitaxial structure and forming a second contact.
Figure 15A:
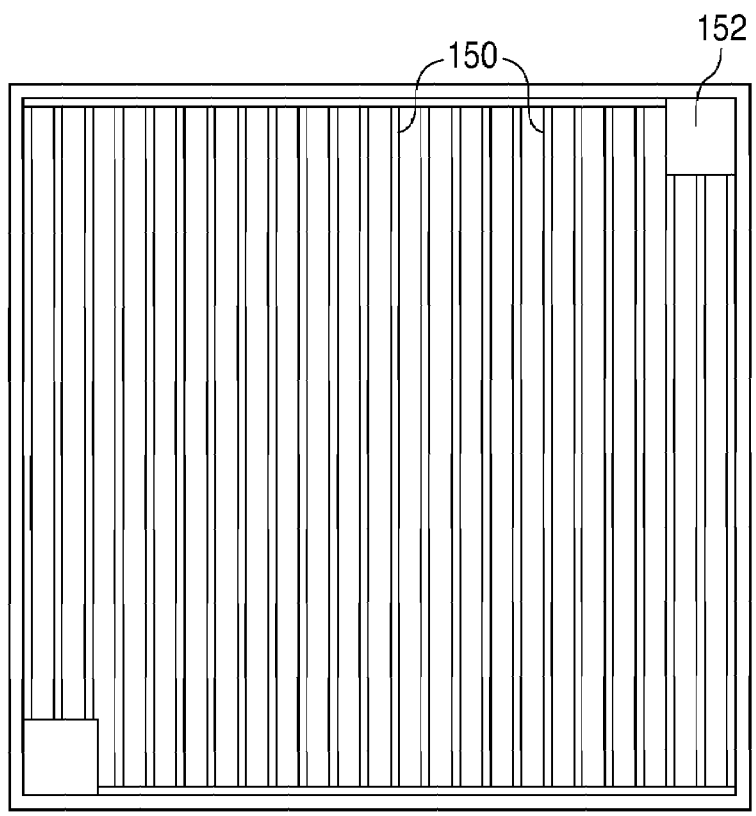
FIGS. 15A and 15B are plan views of examples of an n-contact, according to embodiments of the invention.
Figure 15B:
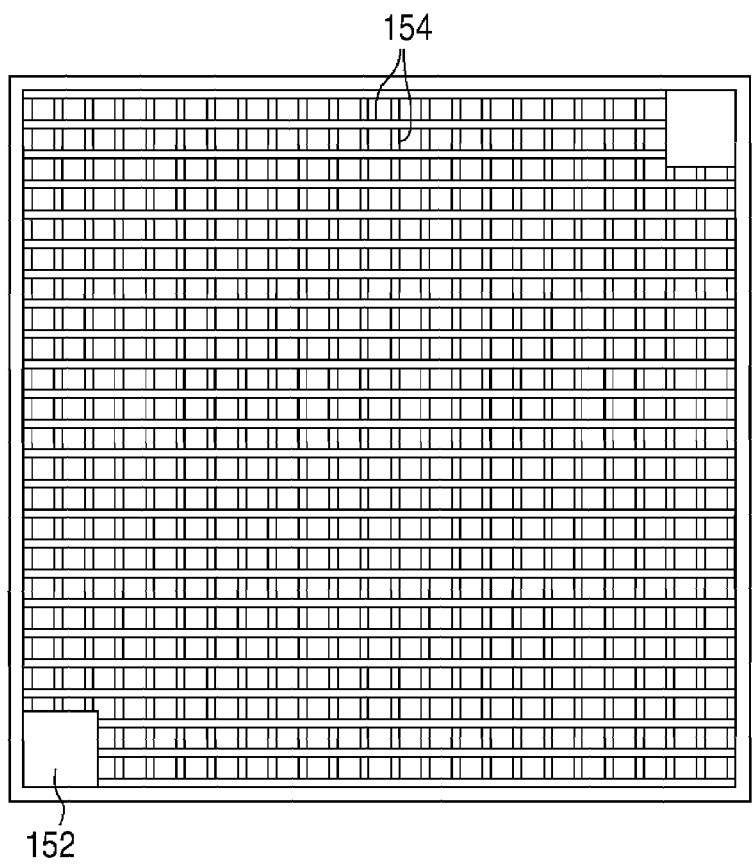

In FIG. 8, the epitaxial structure of the device may be optionally thinned, for example by photoelectrochemical or dry etching, then n-contact 25 is formed on the exposed top surface of the n-type region. The photonic crystal may or may not penetrate the top surface of the device. N-contact 25 may be opaque, translucent, or reflective, thus the lateral extent of n-contact 25 is limited to minimize absorption of light. N-contact 25 is generally disposed in a region without a photonic crystal, as shown in FIG. 8, and in a region overlying a nonconductive region 22, so light is not generated in the portion of the light emitting region directly beneath n-contact 25, since light generated directly beneath the n-contact is likely to be lost to absorption by the contact. FIGS. 15A and 15B are plan views of two possible n-contacts 25. In the device of FIG. 15A, n-contact 25 is several closely spaced metal lines 150. Lines 150 are electrically connected to one or more bonding pads 152, which may be metal pads large enough to electrically connect the device to another structure, such as by a wire bond. In the device of FIG. 15B, n-contact 25 is several closely spaced metal lines 154 formed in a grid. If metal lines 152 and 154 forming n-contact 25 in the devices of FIGS. 15A and 15B are opaque, these metal lines are preferably formed over photonic crystal regions of the device, where no light is generated, rather than over the emitters, where light emitted may be absorbed and lost to the opaque metal lines. Alternatively, metal lines 152 and 154 may be transparent, or if the top surface of the semiconductor structure is planar, n-contact 25 may be a transparent contact that covers all or nearly all of the top surface, to provide current spreading. Typically, the contacts are formed such that all the emitters in the array are activated when the device is forward biased; that is, individual emitters in the array of emitters can not be addressed independently.

Figure 9:
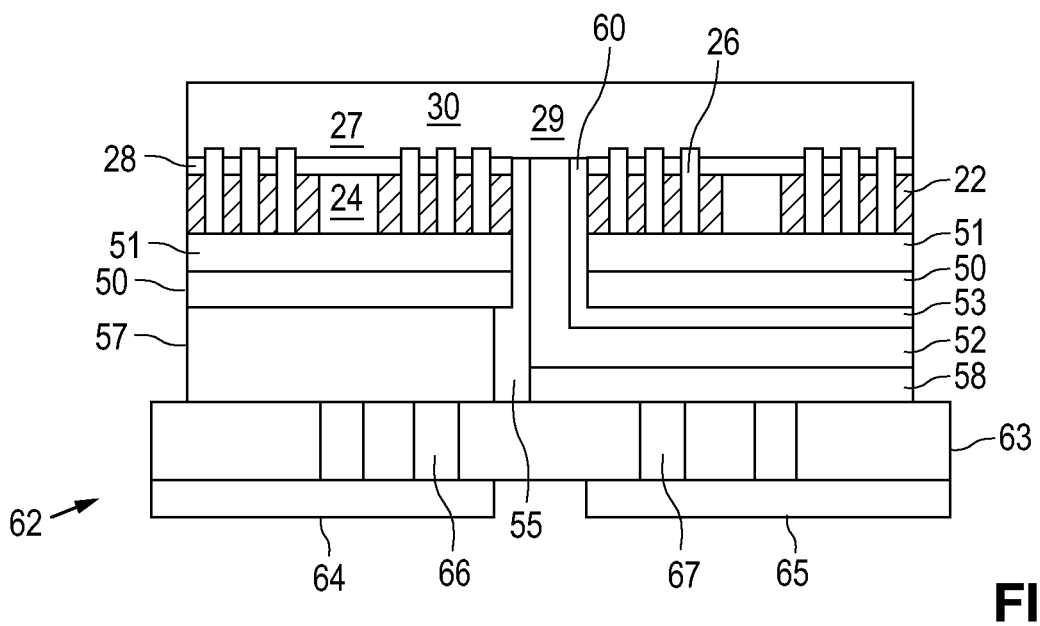
FIG. 9 is a cross sectional view of a part of a flip chip mounted photonic crystal light emitting device according to embodiments of the invention.

FIG. 9 illustrates an alternative embodiment of the invention, where the epitaxial structure is mounted as a flip chip. The device illustrated in FIG. 9 is similar to the device illustrated in FIG. 2 in that the photonic crystal is formed by etching beginning at the surface of a nonconductive region adjacent to the p-type region. Rather than a continuous sheet p-contact 20 and an n-contact formed on opposite sides of the epitaxial structure, as illustrated in FIG. 2, in the device of FIG. 9 a portion of light emitting region 28 and the p-type region or nonconductive region is removed to form a via 60 in which n-contact 52 is formed, electrically connected to n-type region 29. P-contact 50 and optional conductive layer 51 are interrupted to accommodate n-contact 52. N-contact 52 and p-contact 50 may be electrically isolated from each other by dielectric layers 53 and 55, which may be air or a solid insulating material.

The epitaxial structure illustrated in FIG. 9 is shown mounted on a mount 62. Mount 62 may include an electrically insulating and thermally conductive material 63, such as a ceramic or semiconductor. P-contact 50 is physically and electrically connected to mount 62 by p-interconnect 57. N-contact 52 is physically and electrically connected to mount 62 by n-interconnect 58. P- and n-interconnects 57 and 58 may be, for example, solder or gold. One or more conductive vias 66 electrically connect p-interconnect 57 to a p-bonding pad 64 on the bottom of mount 62. One or more conductive vias 67 electrically connect n-interconnect 58 to an n-bonding pad 65 on the bottom of mount 62.

The device illustrated in FIG. 9 may be formed as follows. After the photonic crystal structure is etched as illustrated in FIG. 5, a portion of nonconductive region 22 or p-type region 24, light emitting region 28, and n-type region 27, 29, or 30 is removed to form via 60 illustrated in FIG. 6. Optional conductive layer 50 and p-contact 51 are formed on the remaining portions of nonconductive region 22 and p-type region 24. N-contact 52 is formed in via 60. Additional dielectric and metal layers may be formed as illustrated in FIG. 9. The structure is then mounted on mount 62 by attaching p-contact 50 to p-interconnect 57 and n-contact 52 to n-interconnect 58. Growth substrate 32, shown in FIG. 5, is then removed as described above. Prior to removing the growth substrate, on a flip chip mounted device, a material may be introduced between the epitaxial structure and the mount, to support the epitaxial structure and prevent cracking during removal of the growth substrate. After the growth substrate is removed, the epitaxial structure may be optionally thinned, and the exposed surface of the n-type region may be optionally textured to enhance light extraction.

FIGS. 21-23 illustrate a method of forming a device where current is blocked from the photonic crystal regions by laterally oxidizing a semiconductor layer within the epitaxial structure. In the portion of the device illustrated in FIG. 21, an epitaxial structure including a n-type region 160, a semiconductor layer suitable for lateral oxidation 161, which may be, for example AlInN, and a light emitting region 28 sandwiched between an n-type region 163 and a p-type region 165 is grown over a growth substrate 32. A p-contact metal 20 is formed over the epitaxial structure, followed by a mask 167. The structure is then patterned to form holes 26 in the photonic crystal regions, and emitters 168 without a photonic crystal.

In FIG. 22, portions of layer 161 are oxidized, resulting in conductive portions 161 which are surrounded by nonconductive oxide portions 164. AlInN oxide portions 164 may be formed as follows: the sample is placed in a solution of Nitrilotriacetic acid/potassium hydroxide/water with a pH of 8.5. A platinum wire is also placed in the solution and a bias is established between the sample and the wire driving the oxidation of the AlInN layer. Oxide portions 164 block current injection in the regions of the device with photonic crystal holes 26.

In FIG. 23, mask 167 is stripped, then a contact metal 170 is formed over p-contact 20. One or more optional bonding layers 172 may be formed over contact metal 170, then the structure is bonded to a host substrate 176 via one or more optional bonding layers 174 formed on host substrate 176. Substrate 32 may then be removed, n-type region 160 optionally thinned and/or textured, and an n-contact formed on the exposed n-type region, as illustrated in FIG. 2.

Figure 10:
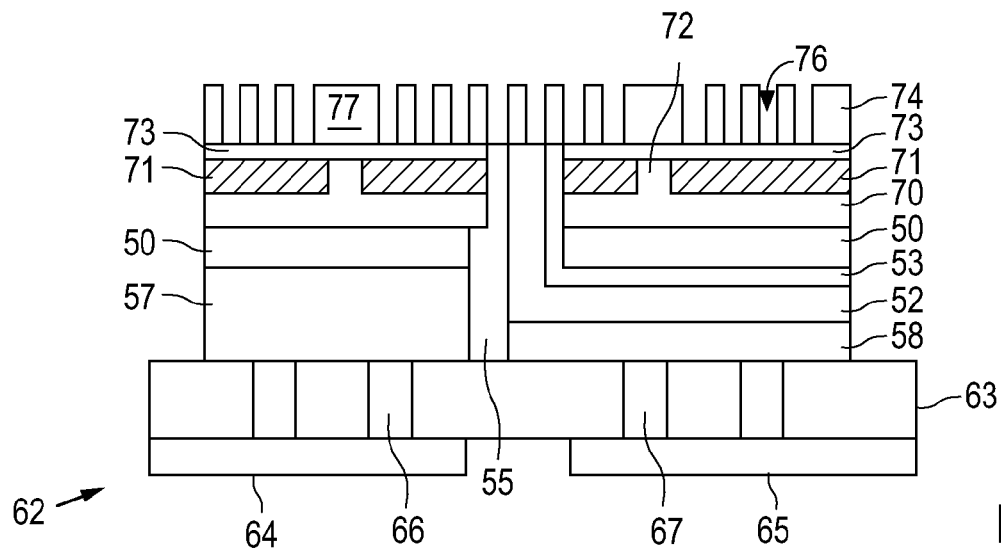
FIG. 10 is a cross sectional view of a part of a flip chip mounted photonic crystal light emitting device, according to alternative embodiments of the invention.

FIG. 10 illustrates an alternative flip chip embodiment of the invention. Unlike the devices described above, where the photonic crystal structure is etched beginning at the surface of the p-type region, the photonic crystal structure of the device of FIG. 10 is formed by etching beginning at the surface of the n-type region. Arrays of holes 76 which from a photonic crystal are formed in a portion of n-type region 74. Another portion 77 of n-type region 74 is uninterrupted by a photonic crystal. These uninterrupted portions of n-type region 74 are disposed over p-type regions 72. P-type regions 72 are surrounded by nonconductive material 71, such that current is injected into light emitting region 73 only in the portions 77 of n-type region 74 that are uninterrupted by a photonic crystal. Nonconductive material regions 71 underlie the arrays of holes 76 which form the photonic crystal. A p-type region 70 underlies nonconductive material regions 71 and p-type regions 72.

In the device of FIG. 10, an n-contact 52 is formed in a via and electrically connected to the back side of n-type region 74. A p-contact 50 is electrically connected to p-type region 70. P- and n-contacts 50 and 52 may be electrically isolated from each other by dielectric layers 53 and 55. The semiconductor layers are mounted on a mount 62, which may be similar to the mount described above in reference to FIG. 9. As in FIG. 9, a p-interconnect 57 electrically and physically connects p-contact 50 to mount 62, and an n-interconnect 58 electrically and physically connects n-contact 52 to mount 62.

Figure 11:
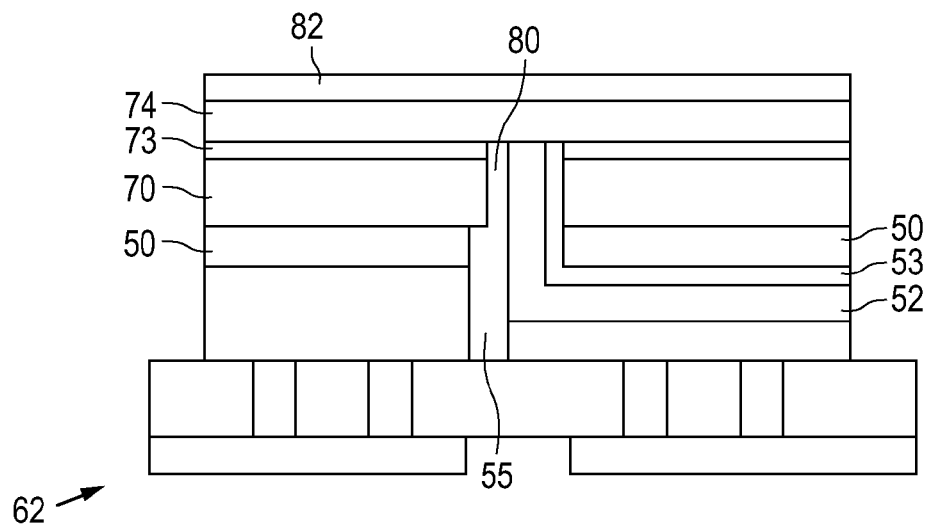
FIG. 11 is a cross sectional view of a part of a device flip chip mounted on a mount with the growth substate removed.
Figure 12:
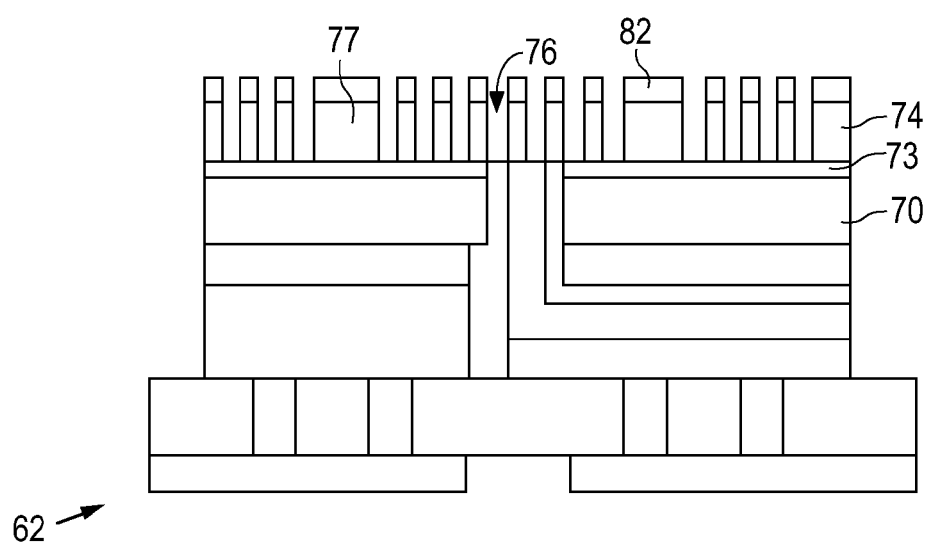
FIG. 12 is a cross sectional view of the device of FIG. 11 after etching a photonic crystal structure.
Figure 13:
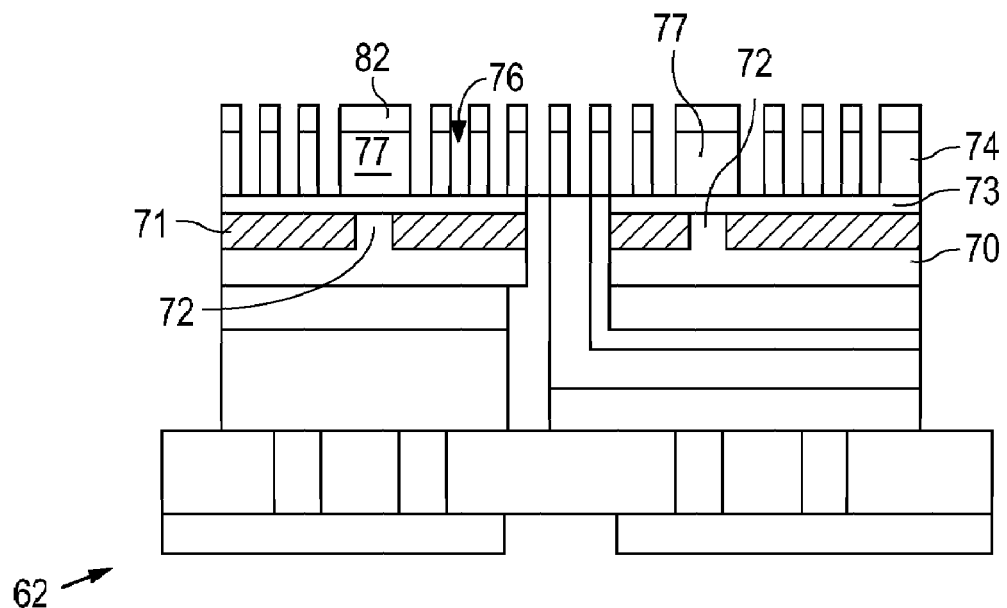
FIG. 13 is a cross sectional view of the device of FIG. 12 after implanting the p-type region to form nonconductive regions.

FIGS. 11-13 illustrate a method of forming the device illustrated in FIG. 10. First, a conventional n-type region 74 is grown over a suitable growth substrate, followed by a conventional light emitting region 73, and a conventional p-type region 70. One or more vias 80 are etched through p-type region 70 and light emitting region 73 to expose portions of n-type region 74. N-contacts 52 are formed in the vias, electrically connected to n-type region 74. P-contacts 50 are formed on the remaining portions of p-type region 70. The device is then flipped over relative to the growth direction and mounted on a mount 62 as described above in reference to FIGS. 9 and 10. The growth substrate is removed as described above, exposing a surface of n-type region 74, and a mask layer 82 is disposed over n-type region 74, resulting in the device illustrated in FIG. 11.

Mask layer 82 is patterned by a process that accounts for possible differences in the height of individual die on a wafer, for example by a flexible stamp process such as wave-printing. The semiconductor layers are then etched to form arrays of holes 76 which form a photonic crystal, and emitter areas 77 of n-type region 74 that are uninterrupted by holes 76, as illustrated in FIG. 12. In FIG. 13, portions 71 of p-type region 70 are implanted, for example with hydrogen, to make them nonconductive. Nonconductive portions 71 are disposed beneath the arrays of holes 76 that form the photonic crystal. The nonconductive portions 71 surround portions 72 which remain p-type. Current is only injected into light emitting region 73 in the vicinity of p-type portions 72, thus light is generated only in the emitters. After implanting nonconductive regions 71, mask 82 may be stripped by a technique appropriate to the masking material, resulting in the device illustrated in FIG. 10.

In the embodiments described above, a structure such as a wavelength converting layer such as one or more phosphors, or secondary optics known in the art such as dichroics or polarizers, may be applied to the emitting surface. The light emitting region may emit blue light. The wavelength-converting layer may be configured to absorb at least a portion of the blue light and emit one or more colors of light at a longer wavelength, such that the composite unconverted blue light and wavelength-converted light appears white or monochromatic, for example red, blue, or green.

The devices described above may have several advantages. Light is generated in parts of the light emitting region that are uninterrupted by the photonic crystal. Thus, the emitters, where light is generated, are physically separated from the photonic crystal regions, where light is extracted from the device. Since the carriers recombine away from the photonic crystal, the holes that form the photonic crystal can be extend through the active region such that the depth of the holes is a high percentage of the total thickness of the device, which can improve the reflective properties of the photonic crystal, potentially resulting in higher confinement of light in the emitters or higher extraction efficiency. This separation may offer the benefit of higher light generating efficiency in the parts of the light emitting region that emit light, since these parts of the light emitting region are not damaged by etching the photonic crystal. In addition, separating the light generating regions of the device from the photonic crystal permits the electrical contacts to be formed on planar surfaces, which is vastly simpler than contacting a textured surface such as a photonic crystal, and may result in a more reliable and robust contact.

Figure 14:
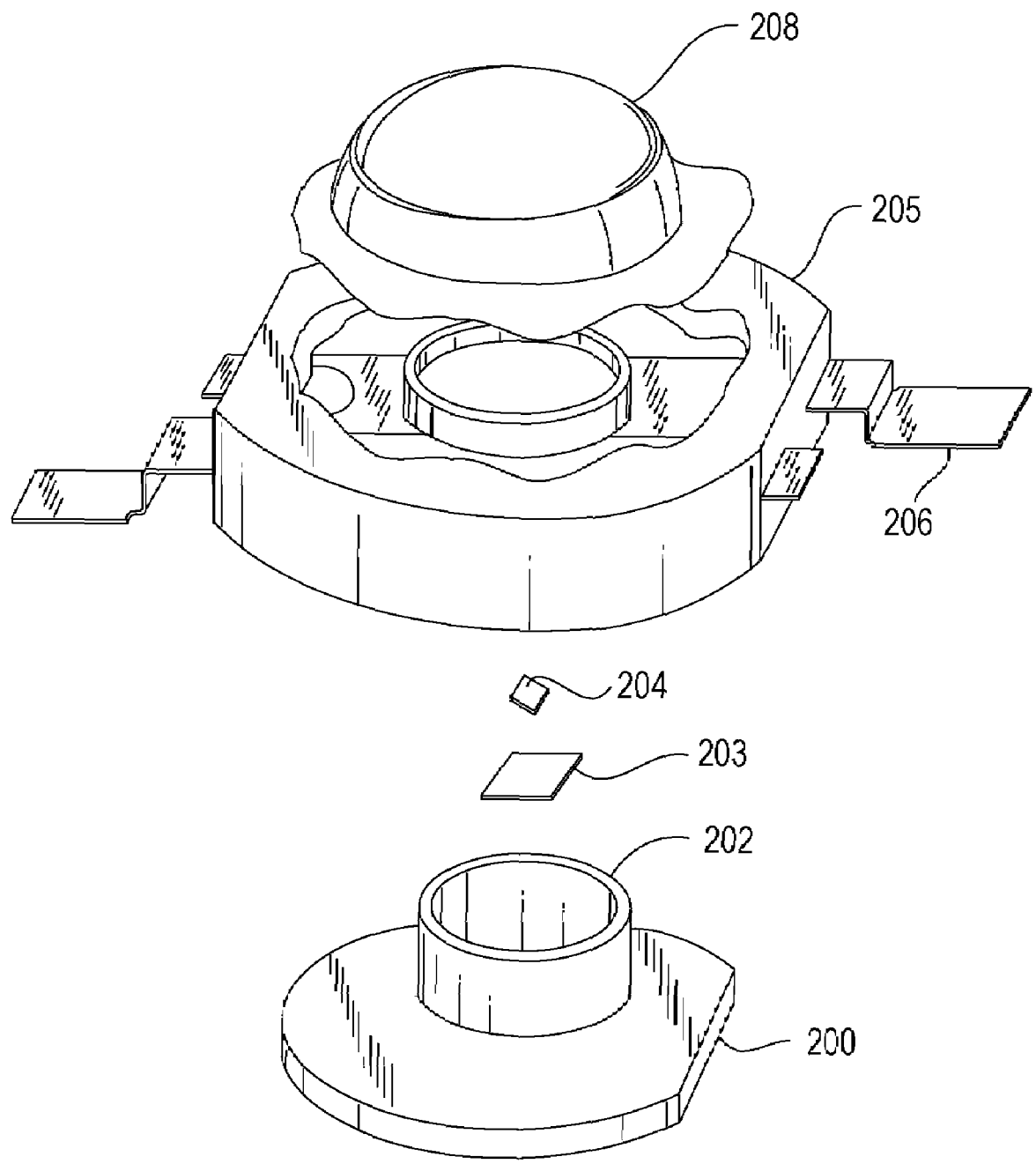
FIG. 14 is an exploded view of a packaged light emitting device.

FIG. 14 is an exploded view of a packaged light emitting device, as described in more detail in U.S. Pat. No. 6,274,924. A heat-sinking slug 200 is placed into an insert-molded leadframe. The insert-molded leadframe is, for example, a filled plastic material 205 molded around a metal frame 206 that provides an electrical path. Slug 200 may include an optional reflector cup 202. The light emitting device die 204, which may be any of the devices described in the embodiments above, is mounted directly or indirectly via a thermally conducting mount 203 to slug 200. A cover 208, which may be an optical lens, may be added.

Having described the invention in detail, those skilled in the art will appreciate that, given the present disclosure, modifications may be made to the invention without departing from the spirit of the inventive concept described herein. For example, though the above examples describe III-nitride devices, embodiments of the invention may be formed in devices formed from other material systems. Therefore, it is What is being claimed is:

1. A device comprising:
   a structure including a light emitting region disposed between an n-type region and a p-type region; and
   a reflector disposed on at least a portion of a bottom surface of the structure, wherein:
   a plurality of holes in the structure are formed in a first region of the structure corresponding to a first portion of the light emitting region;
   a plurality of second regions of the structure, each second region corresponding to a second portion of the light emitting region, are free of holes;
   each of the second regions is surrounded by the first region;
   in areas of the structure disposed between individual holes, a nonconductive material is disposed between the light emitting region and the reflector; and
   the device is configured such that when forward biased, current is injected in the second regions and at least a portion of the first region is substantially free of current.

2. The device of claim 1 wherein a majority of light extracted from the structure is emitted from the first region.

3. The device of claim 1 wherein a majority of light extracted from the structure is emitted from the plurality of second regions.

4. The device of claim 1 wherein light extracted from the structure is emitted from both the first region and the plurality of second regions.

5. The device of claim 1 wherein a majority of light extracted from the structure is extracted through a top surface of the structure.

6. The device of claim 1 wherein the plurality of holes form a photonic crystal comprising a periodic variation in index of refraction.

7. The device of claim 1 wherein the nonconductive material comprises an implanted layer or an oxide layer.

8. The device of claim 1 wherein the structure comprises a III-nitride semiconductor structure.

9. The device of claim 1 wherein the holes extend into light emitting region.

10. The device of claim 1 wherein the holes extend into the n-type region.

11. The device of claim 1 wherein the holes extend into the p-type region.

12. The device of claim 1 wherein the holes extend through an entire thickness of the structure.

13. The device of claim 1 wherein openings to the holes are disposed in a top surface of the structure and the holes extend toward a bottom surface of the structure.

14. The device of claim 1 wherein openings to the holes are disposed in a bottom surface of the structure and the holes extend toward a top surface of the structure.

15. The device of claim 1 wherein the reflector comprises silver.

16. The device of claim 1 wherein the reflector is a first contact electrically connected to the p-type region, the device further comprising a second contact electrically connected to the n-type region proximate a top surface of the structure.

17. The device of claim 16 further comprising a conductive oxide disposed between one of the first and second contacts and the structure.

18. The device of claim 17 wherein the conductive oxide is one of indium tin oxide, InO:Ga, and ZnO:Ga.

19. The device of claim 1 wherein the reflector is a first contact electrically connected to the p-type region, the device further comprising a second contact electrically connected to the n-type region, wherein the second contact is disposed in a via formed in the bottom surface of the structure.

20. The device of claim 19 wherein the plurality of holes are disposed proximate the bottom surface of the structure.

21. The device of claim 19 wherein the plurality of holes are disposed proximate a top surface of the structure.

22. The device of claim 1 wherein at least one of the second regions has a lateral extent between 0.15 µm and 3 µm.

23. The device of claim 1 wherein each of the plurality of second regions is spaced between 0.3 µm and 10 µm from its nearest neighbor second region.

24. The device of claim 1 wherein a maximum thickness of the structure is less than 500 nm.

25. The device of claim 1 wherein the plurality of holes are formed in a lattice having a lattice constant between 200 nm and 500 nm.

26. The device of claim 1 wherein the plurality of holes are formed in a lattice, wherein the lattice is one of triangular, square, hexagonal, honeycomb, and quasi-crystal.

27. The device of claim 1 wherein the plurality of holes are formed in a lattice having a lattice constant; and
   a ratio of a radius of at least one hole to the lattice constant ranges between 0.2 and 0.45.

28. The device of claim 1 further comprising:
   leads electrically connected to the n-type and p-type regions; and
   a cover disposed over the structure.

29. The device of claim 1 further comprising a wavelength-converting material disposed in a path of light extracted from the structure.

30. The device of claim 29 wherein:
   when forward biased, the light emitting region emits light of a first wavelength;
   the wavelength-converting material is configured to absorb at least a portion of the light of a first wavelength and emit light of at least one second wavelength; and
   composite light comprising light of the first wavelength and light of the second wavelength appears white.

31. The device of claim 29 wherein:
   when forward biased, the light emitting region emits light of a first wavelength;
   the wavelength-converting material is configured to absorb at least a portion of the light of a first wavelength and emit light of a second wavelength; and
   after passing through the wavelength-converting material, light escaping the device appears the color of the second wavelength.

32. The device of claim 31 wherein the second wavelength is red, green, or blue.

33. The device of claim 1 further comprising a first contact electrically connected to the n-type region and a second contact electrically connected to the p-type region, wherein the first and second contacts are configured such that when forward biased, current is injected into each of the second regions.

34. The device of claim 1 wherein:
   the plurality of holes formed in the first region of the structure are arranged in a lattice; and
   each of the second regions of the structure, which are free of holes, comprises a region wherein a hole at least one lattice position is omitted.

35. The device of claim 1 wherein:
   the first region comprises holes formed in a lattice and areas of III-nitride material separating individual holes; and
   a lateral extent of each second region is larger than a lateral extent of the III-nitride material separating nearest neighbor holes in the first region.

* * * * *